(12) United States Patent
Chen et al.

(10) Patent No.: US 10,755,873 B2
(45) Date of Patent: Aug. 25, 2020

(54) MEMBRANE CIRCUIT BOARD AND KEYBOARD DEVICE WITH SAME

(71) Applicant: Primax Electronics Ltd., Taipei (TW)

(72) Inventors: Bo-An Chen, Taipei (TW); Chien-Hung Liu, Taipei (TW); Lei-Lung Tsai, Taipei (TW); Chin-Sung Pan, Taipei (TW)

(73) Assignee: PRIMAX ELECTRONICS LTD., Taipei (TW)

(*) Notice: Subject to any disclaimer, the term of this patent is extended or adjusted under 35 U.S.C. 154(b) by 0 days.

(21) Appl. No.: 16/395,007

(22) Filed: Apr. 25, 2019

(65) Prior Publication Data

US 2020/0243277 A1  Jul. 30, 2020

(30) Foreign Application Priority Data

Jan. 29, 2019  (TW) .............................. 108103336 A (51) Int. Cl.
| | |
|---|---|
| *H05K 1/03* | (2006.01) |
| *H01H 13/10* | (2006.01) |
| *H05K 1/11* | (2006.01) |
| *H01H 13/704* | (2006.01) |
| *H01H 13/14* | (2006.01) |
| *H01H 13/7065* | (2006.01) |
| *H05K 1/09* | (2006.01) |

(52) U.S. Cl.
CPC .......... *H01H 13/10* (2013.01); *H01H 13/704* (2013.01); *H05K 1/118* (2013.01); *H01H 13/14* (2013.01); *H01H 13/7065* (2013.01); *H01H 2209/002* (2013.01); *H01H 2209/016* (2013.01); *H05K 1/092* (2013.01); *H05K 2201/0162* (2013.01); *H05K 2201/0179* (2013.01); *H05K 2201/09081* (2013.01)

(58) Field of Classification Search
CPC ...... H01H 13/10; H01H 13/704; H01H 13/14; H01H 2209/016; H05K 1/118; H05K 1/092
See application file for complete search history.

(56) References Cited

U.S. PATENT DOCUMENTS

| | | | | |
|---|---|---|---|---|
| 8,890,014 B1* | 11/2014 | Chen | ................... | G02B 6/0036 200/310 |
| 9,852,853 B2* | 12/2017 | Armendariz | ......... | H01H 13/703 |
| 2004/0108193 A1* | 6/2004 | Schmiz | ................ | H01H 13/702 200/512 |

(Continued)

*Primary Examiner* — Hoa C Nguyen
(74) *Attorney, Agent, or Firm* — Kirton McConkie; Evan R. Witt (57) ABSTRACT

A membrane circuit board includes a first flexible circuit board, a second flexible circuit board and a nanomaterial layer. The nanomaterial layer includes plural polymeric structures. The nanomaterial layer is formed on the first flexible circuit board, the second flexible circuit board and/or a junction region between the edge of the first flexible circuit board and the second flexible circuit board to prevent at least one of the upper metallic conductor line and the lower metallic conductor line from contacting with a specified chemical element. Consequently, the conductive impedance of the upper metallic conductor line and the lower metallic conductor line is not affected by the specified chemical element. Moreover, the present invention also provides a keyboard device with the membrane circuit board.

20 Claims, 5 Drawing Sheets

(56) References Cited

U.S. PATENT DOCUMENTS

| | | | |
|---|---|---|---|
| 2013/0082262 A1* | 4/2013 | Honda | G02F 1/1337 |
| | | | 257/57 |
| 2013/0207793 A1* | 8/2013 | Weaber | G06F 1/1626 |
| | | | 340/407.2 |
| 2017/0032909 A1* | 2/2017 | Chen | H01H 3/125 |
| 2017/0133174 A1* | 5/2017 | Han | C23C 18/1689 |
| 2017/0271293 A1* | 9/2017 | Heo | H05K 1/111 |

* cited by examiner

MEMBRANE CIRCUIT BOARD AND KEYBOARD DEVICE WITH SAME

FIELD OF THE INVENTION

The present invention relates to an input device, and more particularly to a membrane circuit board for an input device.

BACKGROUND OF THE INVENTION

Generally, the widely-used peripheral input device of a computer system includes for example a mouse device, a keyboard device, a trackball device, or the like. Via the keyboard device, characters or symbols can be inputted into the computer system directly. As a consequence, most users pay much attention to the keyboard devices.

Figure 1:
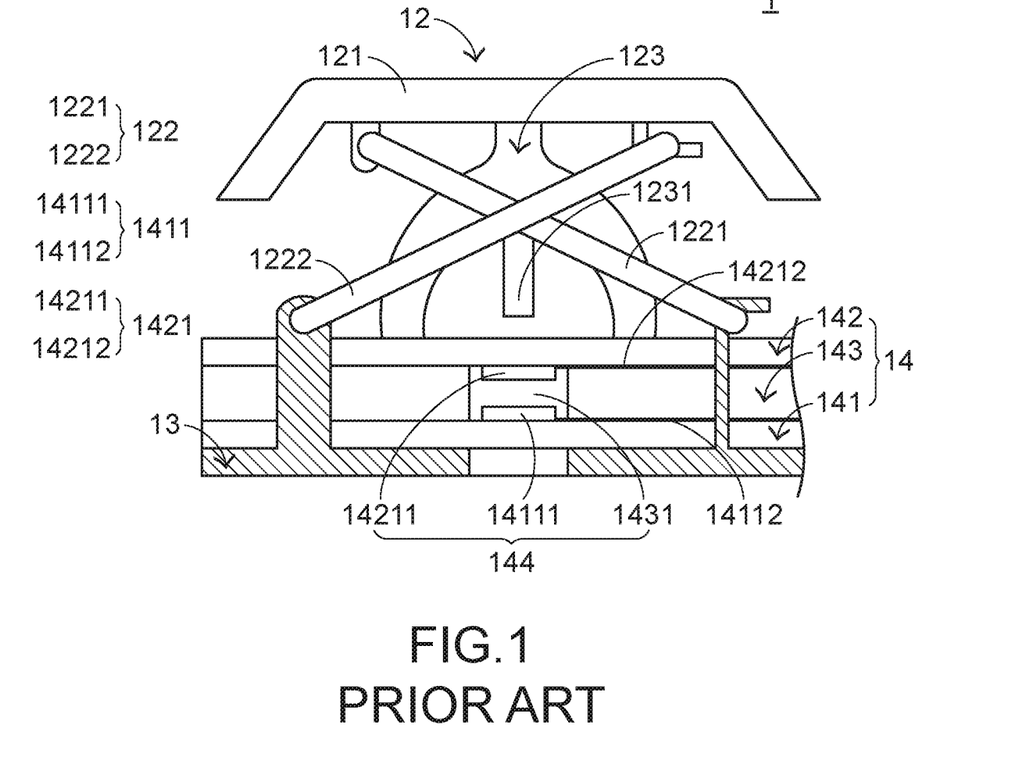
FIG. 1 is a schematic side view illustrating a portion of a conventional keyboard device and taken along a viewpoint.

FIG. 1 is a schematic side view illustrating a portion of a conventional keyboard device and taken along a viewpoint. The conventional keyboard device 1 comprises a base plate 13, a membrane circuit board 14 and plural key structures 12. Each of the plural key structures 12 comprises a keycap 121, a scissors-type connecting element 122 and an elastic element 123. The scissors-type connecting element 122 is connected between the keycap 121 and the base plate 13. The scissors-type connecting element 122 comprises a first frame 1221 and a second frame 1222. The second frame 1222 is pivotally coupled to the first frame 1221. Consequently, the first frame 1221 and the second frame 1222 can be swung relative to each other. The elastic element 123 is arranged between the keycap 121 and the membrane circuit board 14. Moreover, the elastic element 123 comprises a contacting part 1231.

The membrane circuit board 14 comprises an upper film layer 142, a lower film layer 141 and an intermediate film layer 143. The intermediate film layer 143 is arranged between the upper film layer 142 and the lower film layer 141. A first circuit pattern 1421 is formed on a bottom surface of the upper film layer 142. The first circuit pattern 1421 comprises plural upper silver paste conductor lines 14212 and plural upper contacts 14211. The upper contacts 14211 are aligned with the plural key structures 12, respectively. A second circuit pattern 1411 is formed on a top surface of the lower film layer 141. The second circuit pattern 1411 comprises plural lower silver paste conductor lines 14112 and plural lower contacts 14111. The plural lower contacts 14111 are aligned with the plural upper contacts 14211, respectively. In addition, the intermediate film layer 143 comprises plural perforations 1431 corresponding to the plural upper contacts 14211 and the plural lower contacts 14111. Each of the upper contacts 14211 and the corresponding lower contact 14111 are collectively defined as a membrane switch 144.

While the keycap 121 of any key structure 12 is depressed and moved downwardly relative to the base plate 13, the first frame 1221 and the second frame 1222 of the scissors-type connecting element 122 are switched from an open-scissors state to a stacked state. Moreover, as the keycap 121 is moved downwardly to compress the elastic element 123, the corresponding upper contact 14211 is contacted with and triggered by the contacting part 1231 of the elastic element 123. Consequently, the corresponding upper contact 14211 is penetrated through the corresponding perforation 1431 and contacted with the corresponding lower contact 14111. Under this circumstance, the corresponding membrane switch 144 is electrically conducted. When the keycap 121 of the key structure 12 is no longer depressed, the keycap 121 is moved upwardly relative to the base plate 13 in response to an elastic force of the elastic element 123. Meanwhile, the first frame 1221 and the second frame 1222 are switched from the stacked state to the open-scissors state again, and the keycap 121 is returned to its original position.

Figure 2:
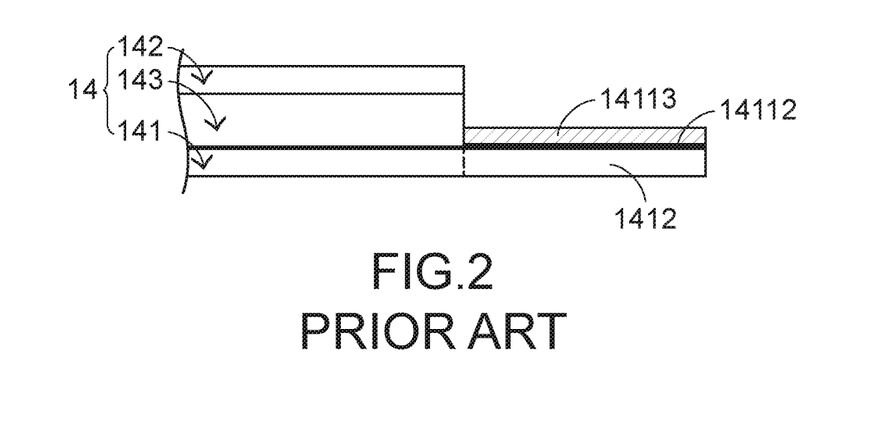
FIG. 2 is a schematic side view illustrating a portion of the membrane circuit board of the conventional keyboard device and taken along another viewpoint.
Figure 3:
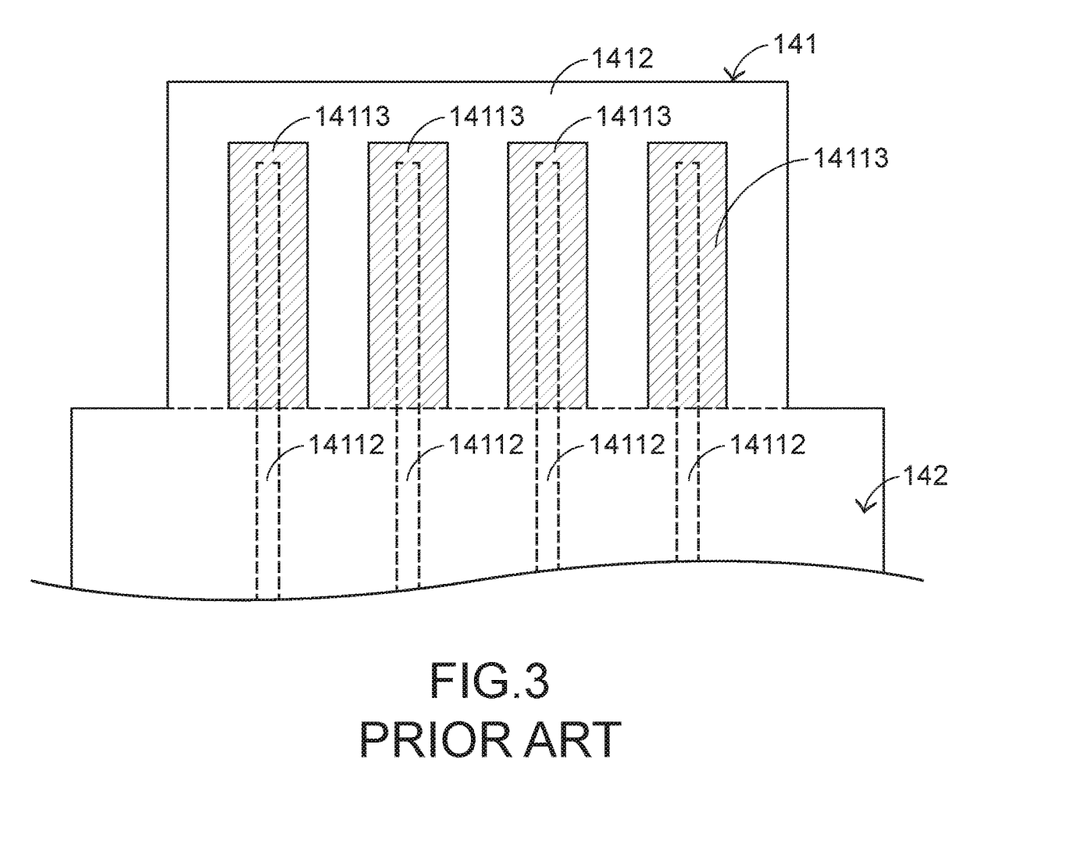
FIG. 3 is a schematic top view illustrating a portion of the membrane circuit board as shown in FIG. 2.

FIG. 2 is a schematic side view illustrating a portion of the membrane circuit board of the conventional keyboard device as shown in FIG. 1 and taken along another viewpoint. FIG. 3 is a schematic top view illustrating a portion of the membrane circuit board as shown in FIG. 2. The lower film layer 141 of the membrane circuit board 14 further comprises an extension part 1412. Moreover, at least some of the lower silver paste conductor lines 14112 of the second circuit pattern 1411 are formed on the extension part 1412 as plural pins. Moreover, plural carbon ink protective layers 14113 are formed over respective pins to protect the lower silver paste conductor lines. When these pins are inserted into a connector (not shown), the connector may pierce the carbon ink protective layers 14113 to contact the lower silver paste conductor lines 14112. Consequently, the electric connection is established.

However, the membrane circuit board 14 and the keyboard device 1 with the membrane circuit board 14 still have some drawbacks. For example, in case that the sulfur-containing air enters the membrane circuit board 14 and contacts with the upper silver paste conductor lines 14212 of the first circuit pattern 1421 and the lower silver paste conductor lines 14112 of the second circuit pattern 1411, the upper silver paste conductor lines 14212 and the lower silver paste conductor lines 14112 are gradually turned into silver sulfide. Consequently, the conductive impedance is gradually increased, and the upper silver paste conductor lines 14212 and the lower silver paste conductor lines 14112 are unable to transfer electronic signals.

Since the lower silver paste conductor lines 14112 and the carbon ink protective layers 14113 are formed through different fabricating processes, it is difficult to align the lower silver paste conductor lines 14112 with the carbon ink protective layers 14113. If any pin is deviated from the corresponding carbon ink protective layer 14113, the electric connection between the membrane circuit board 14 and the connector is adversely affected.

Consequently, the conventional membrane circuit board and the conventional keyboard device with the membrane circuit board need to be further improved.

SUMMARY OF THE INVENTION

An object of the present invention provides a membrane circuit board. The membrane circuit board includes a first flexible circuit board, a second flexible circuit board and a nanomaterial layer. The nanomaterial layer is formed on the first flexible circuit board, the second flexible circuit board and/or a junction region between the edge of the first flexible circuit board and the second flexible circuit board to prevent at least one of the upper metallic conductor line and the lower metallic conductor line from contacting with a specified chemical element. Consequently, the conductive impedance of the upper metallic conductor line and the lower metallic conductor line is not affected by the specified chemical element.

Another object of the present invention provides a keyboard device with the membrane circuit board.

In accordance with an aspect of the present invention, a membrane circuit board is provided. The membrane circuit board includes a first flexible circuit board, a second flexible circuit board and a nanomaterial layer. A first circuit pattern is formed on the first flexible circuit board. The first circuit pattern includes an upper metallic conductor line and an upper contact. The second circuit pattern is formed on the second flexible circuit board. The second circuit pattern includes a lower metallic conductor line and a lower contact corresponding to the upper contact. The upper contact and the lower contact are separated from each other by a spacing distance. The upper contact and the lower contact collectively defined as a membrane switch. The nanomaterial layer includes plural polymeric structures. The nanomaterial layer is formed on the first flexible circuit board, the second flexible circuit board and/or a junction region between the edge of the first flexible circuit board and the second flexible circuit board to prevent at least one of the upper metallic conductor line and the lower metallic conductor line from contacting with a specified chemical element. Consequently, the conductive impedance of the upper metallic conductor line and the lower metallic conductor line is not affected by the specified chemical element.

In accordance with another aspect of the present invention, a keyboard device is provided. The keyboard device includes a membrane circuit board and a key structure. The membrane circuit board includes a first flexible circuit board, a second flexible circuit board and a nanomaterial layer. A first circuit pattern is formed on the first flexible circuit board. The first circuit pattern includes an upper metallic conductor line and an upper contact. The second circuit pattern is formed on the second flexible circuit board. The second circuit pattern includes a lower metallic conductor line and a lower contact corresponding to the upper contact. The upper contact and the lower contact are separated from each other by a spacing distance. The upper contact and the lower contact collectively defined as a membrane switch. The nanomaterial layer includes plural polymeric structures. The nanomaterial layer is formed on the first flexible circuit board, the second flexible circuit board and/or a junction region between the edge of the first flexible circuit board and the second flexible circuit board to prevent at least one of the upper metallic conductor line and the lower metallic conductor line from contacting with a specified chemical element. Consequently, the conductive impedance of the upper metallic conductor line and the lower metallic conductor line is not affected by the specified chemical element. The membrane switch is triggered through the key structure.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 4:
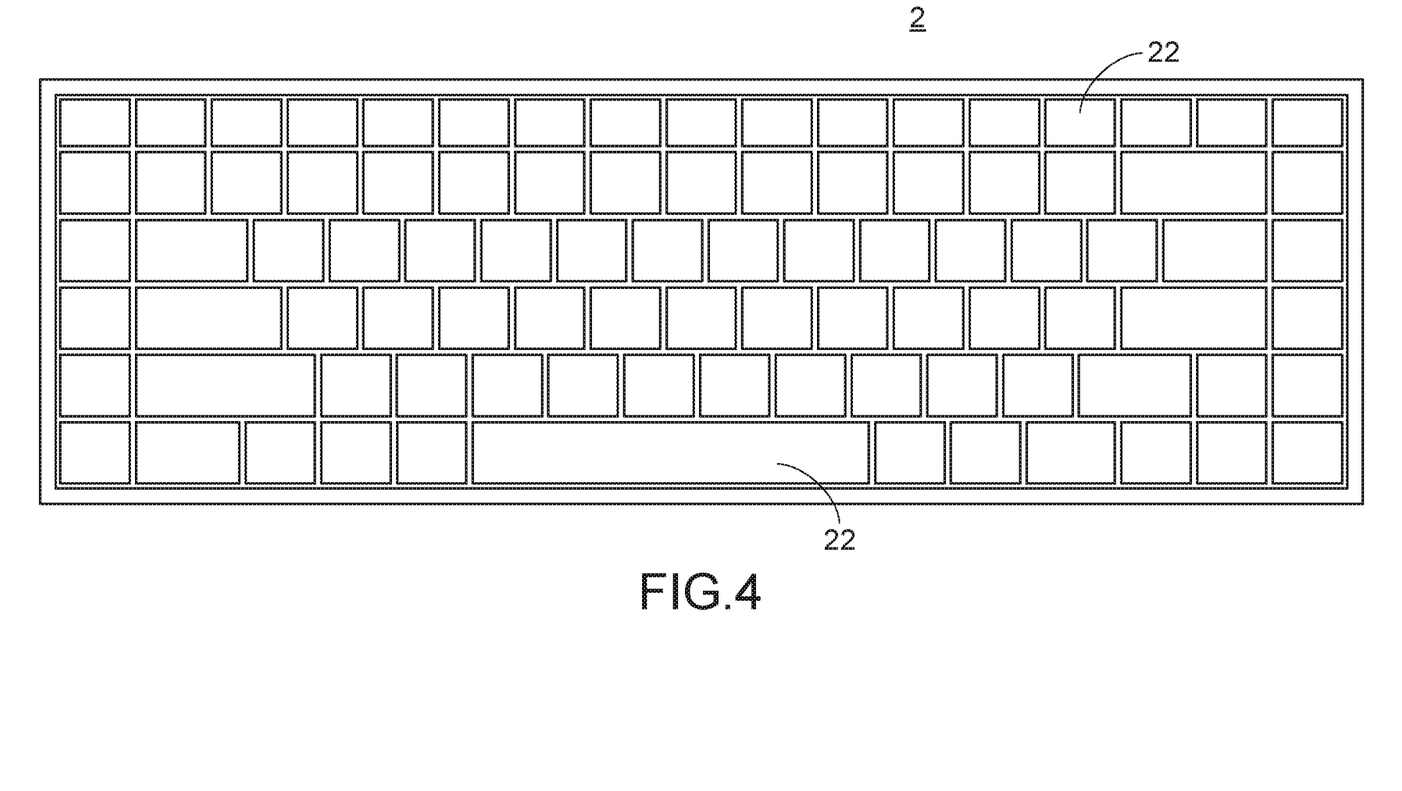
FIG. 4 is a schematic top view illustrating the outer appearance of a keyboard device according to an embodiment of the present invention.
Figure 5:
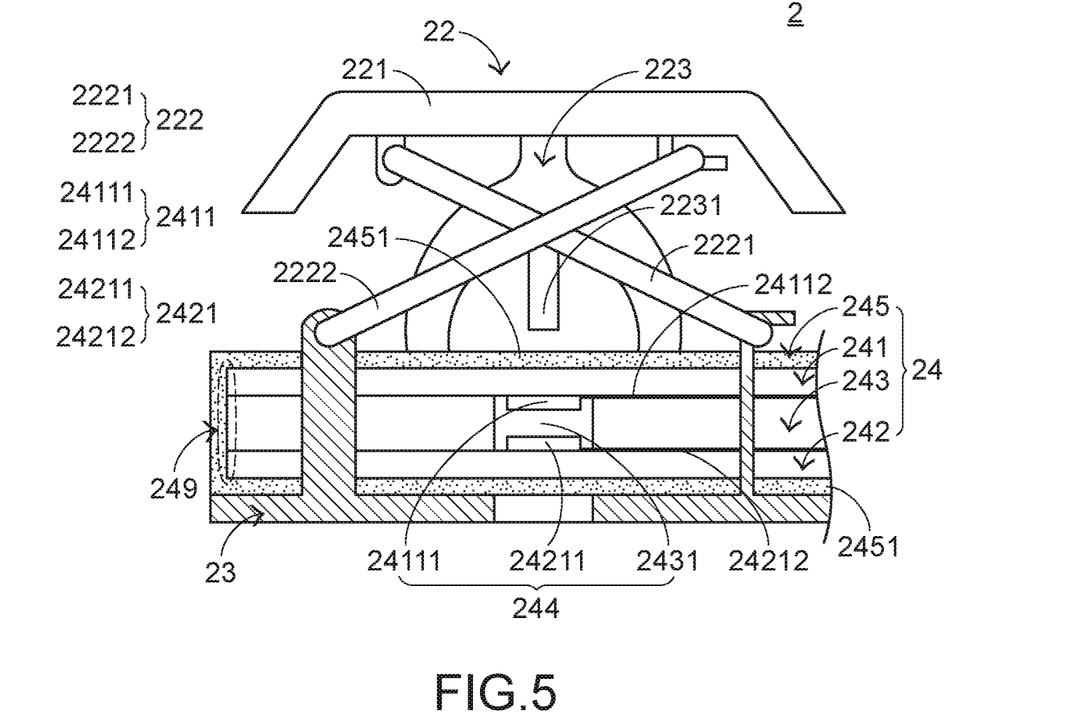
FIG. 5 is a schematic side view illustrating a portion of the keyboard device as shown in FIG. 4 and taken along a viewpoint.

Please refer to FIGS. 4 and 5. FIG. 4 is a schematic top view illustrating the outer appearance of a keyboard device according to an embodiment of the present invention. FIG. 5 is a schematic side view illustrating a portion of the keyboard device as shown in FIG. 4 and taken along a viewpoint. For succinctness, only one key structure and associated components are shown in FIG. 5. The keyboard device 2 comprises plural key structures 22, a base plate 23 and a membrane circuit board 24. The membrane circuit board 24 is arranged between the plural key structures 22 and the base plate 23. These key structures 22 are classified into some types, e.g., ordinary keys, numeric keys and function keys. When one of the key structures 22 is depressed by the user's finger, a corresponding key signal is generated to a computer (not shown), and thus the computer executes a function corresponding to the depressed key structure. For example, when an ordinary key is depressed, a corresponding English letter or symbol is inputted into the computer. When a numeric key is depressed, a corresponding number is inputted into the computer. In addition, the function keys (F1~F12) can be programmed to provide various quick access functions.

In an embodiment, the membrane circuit board 24 comprises a first flexible circuit board 241, a second flexible circuit board 242, an intermediate board 243 and a nanomaterial layer 245. A first circuit pattern 2411 is formed on a bottom surface of the first flexible circuit board 241. The first circuit pattern 2411 comprises plural upper metallic conductor lines 24112 and plural upper contacts 24111. The upper contacts 24111 are aligned with the plural key structures 22, respectively. A second circuit pattern 2421 is formed on a top surface of the second flexible circuit board 242. The second circuit pattern 2421 comprises plural lower metallic conductor lines 24212 and plural lower contacts 24211. The plural lower contacts 24211 are aligned with the plural upper contacts 24111, respectively. In addition, the intermediate board 243 comprises plural perforations 2431 corresponding to the plural upper contacts 24111 and the plural lower contacts 24211. Each of the upper contacts 24111 and the corresponding lower contact 24211 are collectively defined as a membrane switch 244.

Each of the key structures 22 comprises a keycap 221, a connecting element 222 and an elastic element 223. The connecting element 222 is connected between the keycap 221 and the base plate 23. The connecting element 222 comprises a first frame 2221 and a second frame 2222. The second frame 2222 is pivotally coupled to the first frame 2221. Consequently, the first frame 2221 and the second frame 2222 can be swung relative to each other. The elastic element 223 is arranged between the keycap 221 and the membrane circuit board 24. Moreover, the elastic element 223 comprises a contacting part 2231.

While the keycap 221 of any key structure 22 is depressed and moved downwardly relative to the base plate 23, the first frame 2221 and the second frame 2222 of the connecting element 222 are switched from an open-scissors state to a stacked state. Moreover, as the keycap 221 is moved downwardly to compress the elastic element 223, the corresponding upper contact 24111 is contacted with and triggered by the contacting part 2231 of the elastic element 223. Consequently, the corresponding upper contact 24111 is penetrated through the corresponding perforation 2431 and contacted with the corresponding lower contact 24211. Under this circumstance, the corresponding membrane switch 244 is electrically conducted. When the keycap 221 of the key structure 22 is no longer depressed, the keycap 221 is moved upwardly relative to the base plate 23 in response to an elastic force of the elastic element 223. Meanwhile, the first frame 2221 and the second frame 2222 are switched from the stacked state to the open-scissors state again, and the keycap 221 is returned to its original position.

In an embodiment, the nanomaterial layer 245 of the membrane circuit board 24 comprises plural polymeric structures 2451. These polymeric structures 2451 are formed on the first flexible circuit board 241, the second flexible circuit board 242 and/or a junction region 249 between the edge of the first flexible circuit board 241 and the second flexible circuit board 242. Due to the polymeric structures 2451, the upper metallic conductor lines 24112 of the first flexible circuit board 241 and the lower metallic conductor lines 24212 of the second flexible circuit board 242 are not exposed to a specified chemical element. Consequently, the conductive impedance is not adversely affected.

Preferably, the upper metallic conductor lines 24112 of the first flexible circuit board 241 and the lower metallic conductor lines 24212 of the second flexible circuit board 242 are silver paste conductor lines. An example of the specified chemical element is sulfur (S). In an embodiment, the polymeric structures 2451 of the nanomaterial layer 245 are made of a nonpolar compound. In the nonpolar compound, a molecule containing silicon (Si) and oxygen (O), e.g., a silicon dioxide ($SiO_2$) chain or a Si—O—Si chain, is used as the backbone. Moreover, the backbone is surrounded by methyl group, phenyl group or any other appropriate nonpolar group. Since the polymeric structures 2451 repel the sulfur (S) element, the upper metallic conductor lines 24112 and the lower metallic conductor lines 24212 will not be gradually turned into silver sulfide. In other words, the conductive impedances of the upper metallic conductor lines 24112 and the lower metallic conductor lines 24212 will not be adversely affected.

Preferably, the first flexible circuit board 241 and the second flexible circuit board 242 of the membrane circuit board 24 are covered by the nanomaterial layer 245 (see FIG. 5). Consequently, the gas containing the specified chemical element (e.g., the sulfur-containing air) cannot easily enter the membrane circuit board 24 and contact with the upper metallic conductor lines 24112 and the lower metallic conductor lines 24212. Preferably but not exclusively, the nanomaterial layer 245 is formed by a soaking process, a spraying process, a sputtering process or a deposition process. By controlling the reaction time period and other operating conditions, the thickness of the nanomaterial layer 245 is in the range between 1 nm and 300 nm.

Figure 6:
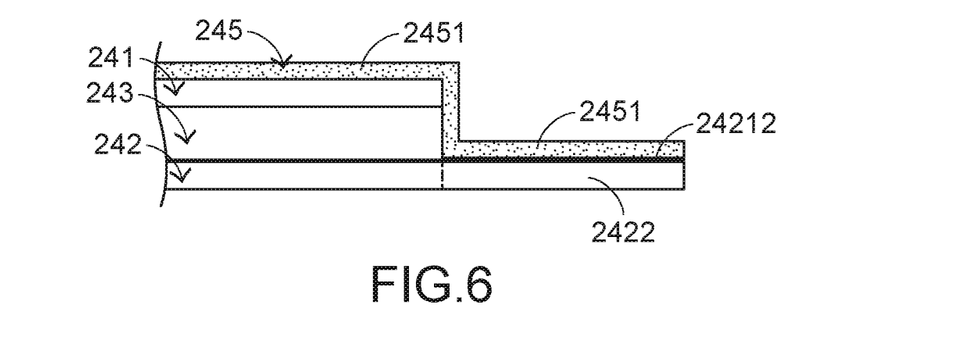
FIG. 6 is a schematic side view illustrating a portion of the membrane circuit board as shown in FIG. 4 and taken along another viewpoint.
Figure 7:
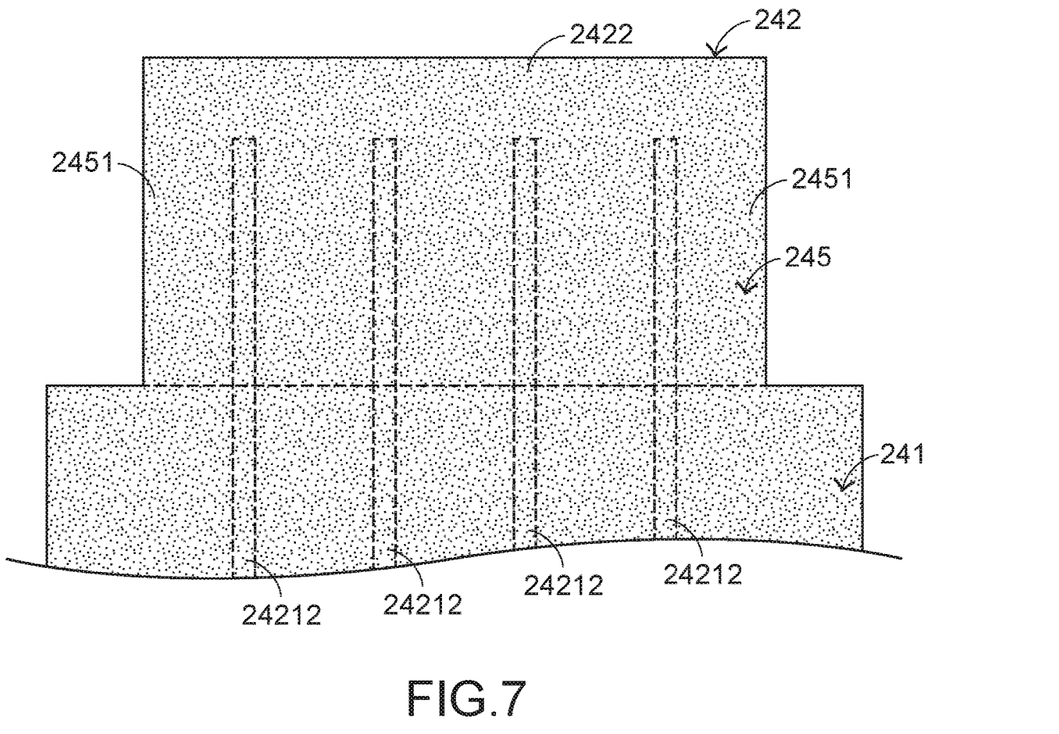
FIG. 7 is a schematic top view illustrating a portion of the membrane circuit board as shown in FIG. 6.

Please refer to FIGS. 6 and 7. FIG. 6 is a schematic side view illustrating a portion of the membrane circuit board as shown in FIG. 4 and taken along another viewpoint. FIG. 7 is a schematic top view illustrating a portion of the membrane circuit board as shown in FIG. 6. The second flexible circuit board 242 of the membrane circuit board 24 further comprises an extension part 2422. Moreover, at least a portion of the second circuit pattern 2421 is formed on the extension part 2422. That is, at least some of the lower metallic conductor lines 24212 are extended to the extension part 2422 and formed as plural pins. When these pins are inserted into a connector (not shown), the electric connection is established. Moreover, the nanomaterial layer 245 is formed over the pins to protect the lower metallic conductor lines 24212. Since the pins are not in contact with the specified chemical element, the conductive impedance is not adversely affected.

In an embodiment, the nanomaterial layer 245 formed over the pins is the same nano-coating layer (see FIG. 7). In accordance with a feature of the present invention, two regions of the nanomaterial layer 245 within a specified distance allow electrons to pass through and results in electric connection, and two regions of the nanomaterial layer 245 beyond the specified distance are insulated from each other. Consequently, all pins can be electrically connected with the connector, but every two adjacent pins are not short-circuited. In other words, the problem of difficulty aligning the lower silver paste conductor lines 14112 with the carbon ink protective layers 14113 in the conventional membrane circuit board 14 will be avoided.

It is noted that numerous modifications and alterations may be made while retaining the teachings of the invention. For example, in another embodiment, the first flexible circuit board 241 further comprises an extension part. Moreover, at least a portion of the first circuit pattern 2411 is formed on the extension part. That is, at least some of the upper metallic conductor lines 24112 are extended to the extension part and formed as plural pins. Moreover, the nanomaterial layer 245 is formed over the pins to protect the upper metallic conductor lines 24112. Since the pins are not in contact with the specified chemical element, the conductive impedance is not adversely affected.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A membrane circuit board, comprising:
a first flexible circuit board, wherein a first circuit pattern is formed on the first flexible circuit board, and the first circuit pattern comprises an upper metallic conductor line and an upper contact;
a second flexible circuit board, wherein a second circuit pattern is formed on the second flexible circuit board, and the second circuit pattern comprises a lower metallic conductor line and a lower contact corresponding to the upper contact, wherein the upper contact and the lower contact are separated from each other by a spacing distance, and the upper contact and the lower contact collectively defined as a membrane switch; and
a nanomaterial layer comprising plural polymeric structures, wherein the nanomaterial layer is formed on the first flexible circuit board, the second flexible circuit board and/or a junction region between the edge of the first flexible circuit board and the second flexible circuit board to prevent at least one of the upper metallic conductor line and the lower metallic conductor line from contacting with a specified chemical element, so that conductive impedance of the upper metallic conductor line and the lower metallic conductor line is not affected by the specified chemical element.

2. The membrane circuit board according to claim 1, wherein the specified chemical element is sulfur (S).

3. The membrane circuit board according to claim 2, wherein at least one of the polymeric structures is made of a polymeric compound containing silicon (Si) and oxygen (O).

4. The membrane circuit board according to claim 1, wherein at least one of the upper metallic conductor line and the lower metallic conductor line is a silver paste conductor line.

5. The membrane circuit board according to claim 1, wherein the first flexible circuit board and the second flexible circuit board are covered by the nanomaterial layer.

6. The membrane circuit board according to claim 1, wherein the first flexible circuit board further comprises an extension part, and at least a portion of the first circuit pattern is formed on extension part to form at least one pin, wherein the nanomaterial layer is formed over the at least one pin.

7. The membrane circuit board according to claim 6, wherein the at least a portion of the first circuit pattern is formed on extension part to form plural pins, wherein the nanomaterial layer is a nano-coating layer and formed over the plural pins.

8. The membrane circuit board according to claim 1, wherein the second flexible circuit board further comprises an extension part, and at least a portion of the second circuit pattern is formed on extension part to form at least one pin, wherein the nanomaterial layer is formed over the at least one pin.

9. The membrane circuit board according to claim 8, wherein the at least a portion of the second circuit pattern is formed on extension part to form plural pins, wherein the nanomaterial layer is a nano-coating layer and formed over the plural pins.

10. The membrane circuit board according to claim 1, wherein the membrane circuit board further comprises an intermediate board between the first circuit pattern and the second circuit pattern, so that the upper contact and the lower contact are separated from each other by the spacing distance, wherein the intermediate board comprises a perforation corresponding to the upper contact and the lower contact.

11. A keyboard device, comprising:
a membrane circuit board comprising:
  a first flexible circuit board, wherein a first circuit pattern is formed on the first flexible circuit board, and the first circuit pattern comprises an upper metallic conductor line and an upper contact;
  a second flexible circuit board, wherein a second circuit pattern is formed on the second flexible circuit board, and the second circuit pattern comprises a lower metallic conductor line and a lower contact corresponding to the upper contact, wherein the upper contact and the lower contact are separated from each other by a spacing distance, and the upper contact and the lower contact collectively defined as a membrane switch; and
  a nanomaterial layer comprising plural polymeric structures,
wherein the nanomaterial layer is formed on the first flexible circuit board, the second flexible circuit board and/or a junction region between the edge of the first flexible circuit board and the second flexible circuit board to prevent at least one of the upper metallic conductor line and the lower metallic conductor line from contacting with a specified chemical element, so that conductive impedance of the upper metallic conductor line and the lower metallic conductor line is not affected by the specified chemical element; and
a key structure for triggering the membrane switch.

12. The keyboard device according to claim 11, wherein the specified chemical element is sulfur (S).

13. The keyboard device according to claim 12, wherein at least one of the polymeric structures is made of a polymeric compound containing silicon (Si) and oxygen (O), and at least one of the upper metallic conductor line and the lower metallic conductor line is a silver paste conductor line.

14. The keyboard device according to claim 11, wherein the first flexible circuit board and the second flexible circuit board are covered by the nanomaterial layer.

15. The keyboard device according to claim 11, wherein the first flexible circuit board further comprises an extension part, and at least a portion of the first circuit pattern is formed on extension part to form at least one pin, wherein the nanomaterial layer is formed over the at least one pin.

16. The keyboard device according to claim 15, wherein the at least a portion of the first circuit pattern is formed on extension part to form plural pins, wherein the nanomaterial layer is a nano-coating layer and formed over the plural pins.

17. The keyboard device according to claim 11, wherein the second flexible circuit board further comprises an extension part, and at least a portion of the second circuit pattern is formed on extension part to form at least one pin, wherein the nanomaterial layer is formed over the at least one pin.

18. The keyboard device according to claim 17, wherein the at least a portion of the second circuit pattern is formed on extension part to form plural pins, wherein the nanomaterial layer is a nano-coating layer and formed over the plural pins.

19. The keyboard device according to claim 11, wherein the key structure comprises a keycap and an elastic element, and the elastic element is arranged between the keycap and the membrane circuit board, wherein when the keycap is pressed, the elastic element is compressed to push the membrane switch, wherein when a pressing force exerted on the keycap is eliminated, the keycap is returned to an original position in response to an elastic force provided by the elastic element.

20. The keyboard device according to claim 11, wherein the membrane circuit board further comprises an intermediate board between the first circuit pattern and the second circuit pattern, so that the upper contact and the lower contact are separated from each other by the spacing distance, wherein the intermediate board comprises a perforation corresponding to the upper contact and the lower contact.

* * * * *